United States Patent
Zheng et al.

(10) Patent No.: US 8,691,647 B1
(45) Date of Patent: Apr. 8, 2014

(54) MEMORY DEVICES CONTAINING A HIGH-K DIELECTRIC LAYER

(75) Inventors: Wei Zheng, Santa Clara, CA (US);
Arvind Halliyal, Cupertino, CA (US);
Mark T. Ramsbey, Sunnyvale, CA (US); Jack F. Thomas, Palo Alto, CA (US)

(73) Assignee: Spansion LLC, Sunnyvale, CA (US)

( * ) Notice: Subject to any disclaimer, the term of this patent is extended or adjusted under 35 U.S.C. 154(b) by 1782 days.

(21) Appl. No.: 10/927,692

(22) Filed: Aug. 27, 2004

Related U.S. Application Data

(62) Division of application No. 10/265,955, filed on Oct. 7, 2002.

(51) Int. Cl.
*H01L 21/336* (2006.01)

(52) U.S. Cl.
USPC ............... 438/257; 438/261; 438/266

(58) Field of Classification Search
USPC ............ 438/257, 261, 263, 264, 266
See application file for complete search history.

(56) References Cited

U.S. PATENT DOCUMENTS

| | | | |
|---|---|---|---|
| 5,901,084 A * | 5/1999 | Ohnakado | 365/185.18 |
| 6,008,091 A | 12/1999 | Gregor et al. | |
| 6,020,238 A | 2/2000 | He et al. | |
| 6,048,766 A | 4/2000 | Gardner et al. | |
| 6,087,696 A * | 7/2000 | Li et al. | 257/321 |
| 6,163,049 A | 12/2000 | Bui | |
| 6,163,050 A | 12/2000 | Hisatomi et al. | |
| 6,166,401 A | 12/2000 | Forbes | |
| 6,319,775 B1 | 11/2001 | Halliyal et al. | |
| 6,495,878 B1 | 12/2002 | Hayashi et al. | |
| 6,512,264 B1 | 1/2003 | Ogle, Jr. et al. | |
| 6,642,573 B1 * | 11/2003 | Halliyal et al. | 257/316 |
| 2001/0011743 A1 | 8/2001 | Arita et al. | |
| 2001/0015456 A1 | 8/2001 | Bui | |
| 2002/0153579 A1 * | 10/2002 | Yamamoto | 257/412 |
| 2003/0030099 A1 | 2/2003 | Hsieh et al. | |
| 2003/0194853 A1 * | 10/2003 | Jeon | 438/591 |

* cited by examiner

Primary Examiner — Jack Chen

(57) ABSTRACT

In one embodiment, a semiconductor device is disclosed. The semiconductor device is formed on a semiconductor substrate having an active region, the semiconductor device comprising: a gate dielectric layer disposed on the semiconductor substrate, the gate dielectric layer having at least two sub-layers with at least one sub-layer having a dielectric constant greater than $SiO_2$; a floating gate formed on the gate dielectric layer defining a channel interposed between a source and a drain formed within the active region of the semiconductor substrate; a control gate formed above the floating gate; and an intergate dielectric layer interposed between the floating gate and the control gate, the intergate dielectric layer comprising: a first layer formed on the floating gate; a second layer formed on the first layer; and a third layer formed on the second layer, wherein each of the first, second and third layers has a dielectric constant greater than $SiO_2$.

20 Claims, 5 Drawing Sheets

MEMORY DEVICES CONTAINING A HIGH-K DIELECTRIC LAYER

CROSS-REFERENCE TO RELATED APPLICATION

The present application is a divisional of and claims priority under 35 U.S.C. '120 to copending, commonly assigned U.S. application Ser. No. 10/265,955, filed Oct. 7, 2002.

FIELD OF THE INVENTION

The present invention relates to memory devices and to methods for their fabrication, and more particularly to memory devices which incorporate therein a high-K layer and to methods of manufacturing same.

BACKGROUND OF THE INVENTION

Non-volatile memory devices are currently in widespread use in electronic components that require the retention of information when electrical power is terminated. Non-volatile memory devices include read-only-memory (ROM), programmable-read-only memory (PROM), erasable-programmable-read-only memory (EPROM), and electrically-erasable-programmable-read-only-memory (EEPROM) devices. EEPROM devices differ from other non-volatile memory devices in that they can be electrically programmed and erased. Flash EEPROM devices are similar to EEPROM devices in that memory cells can be programmed and erased electrically. However, Flash EEPROM devices enable the erasing of all memory cells in the device using a single electrical current pulse.

A conventional floating gate FLASH memory device includes a FLASH memory cell characterized by a vertical stack on a semiconductor substrate. The semiconductor substrate is doped with either n-type or p-type impurities to form an active region in the semiconductor substrate. The vertical stack includes a gate dielectric, a floating gate, an intergate dielectric layer and a control gate. The gate dielectric of silicon dioxide (SiO2 gate dielectric) is formed on the semiconductor substrate. The floating gate (sometimes referred as the Acharge storing layer@) of n-type polysilicon is formed on the gate dielectric. The intergate dielectric layer (e.g., layers of SiO2, silicon nitride (Anitride@) and SiO2 and commonly referred to as an ONO layer) is formed on the floating gate. The control gate of n-type polysilicon is formed on the intergate dielectric layer. The floating gate formed on the SiO2 gate dielectric defines a channel interposed between a source and a drain formed within the active region of the semiconductor substrate. The source and drain are formed by dopant impurities introduced into the semiconductor substrate.

Generally speaking, a FLASH memory cell is programmed by inducing hot electron injection from a portion of the semiconductor substrate, such as the channel section near the drain, to the floating gate. Electron injection introduces negative charge into the floating gate. The injection mechanism can be induced by grounding the source and a bulk portion of the semiconductor substrate and applying a relatively high positive voltage to the control gate to create an electron attracting field and applying a positive voltage of moderate magnitude to the drain in order to generate "hot" (high energy) electrons. After sufficient negative charge accumulates in the floating gate, the negative potential of the floating gate raises the threshold voltage of its field effect transistor (FET) and inhibits current flow through the channel during a subsequent "read" mode. The magnitude of the read current is used to determine whether or not a FLASH memory cell is programmed.

The act of discharging the floating gate of a FLASH memory cell is called the erase function. The erase function is typically carried out by a Fowler-Nordheim tunneling mechanism between the floating gate and the source of the transistor (source erase or negative gate erase), or between the floating gate and the semiconductor substrate (channel erase). A source erase operation is induced by applying a high positive voltage to the source and a zero or negative voltage to the control gate and zero voltage to the semiconductor substrate while floating the drain of the respective FLASH memory cell.

Turning to FIG. 1, FIG. 1 illustrates, in cross-section, a conventional semiconductor device 100 (i.e., a floating-gate transistor). Device 100 includes a semiconductor substrate 102 having an active region 104. A source 106 and a drain 108 are formed in the active region 104. A gate dielectric 110 is formed on the semiconductor substrate 102. A floating gate 112 is formed on the gate dielectric 110. The floating gate 112 defines the channel 114 between the source 106 and the drain 108. An intergate dielectric layer 116 is formed on the floating gate 112. The intergate dielectric layer 116 includes therein three layers which form an ONO structure. In the ONO structure of the intergate dielectric layer 116, a first layer 118 of silicon oxide is formed on the floating gate 112, a second layer 120 of silicon nitride is formed on the first layer 118, and a third layer 122, also silicon oxide, is formed on the second layer 120. A control gate 124 is formed on the ONO structure of the intergate dielectric layer 116. The gate dielectric 110, the floating gate 112, the intergate dielectric layer 116, and the control gate 124 form a vertical stack characteristic of a FLASH memory cell. Spacers 126 are formed on the sidewalls of the vertical stack. Isolation techniques that are known in the art may be used to electrically isolate the semiconductor device 100 from other semiconductor devices.

More recently dielectric memory cell structures, such as SONOS, have been developed. Turning to FIG. 2, FIG. 2 illustrates, in cross-section, a conventional SONOS-type memory device 200 suitable for use in a two-bit EEPROM device. Memory device 200 includes source/drain regions 206 and 208 located in an active region 204 of semiconductor substrate 202 and separated by a channel region 214. An intergate dielectric layer 216 (e.g., an ONO structure) overlies portions of the source region 206 and the drain region 208, as well as the channel region 214. A control gate electrode 224 is formed on the intergate dielectric layer 216. The control gate electrode 224 and the intergate dielectric layer 216 form a stacked-gate structure.

ONO structure 216 includes a first silicon oxide layer 218 overlying channel region 208. A silicon nitride layer 220 overlies first silicon oxide layer 218. A second silicon oxide layer (or top oxide layer) 222 overlies silicon nitride layer 220.

As is shown in FIG. 2, a device 200 is characterized by a vertical stack of an insulating tunnel oxide layer, a charge trapping nitride layer, an insulating top oxide layer, and a polysilicon control gate positioned on top of a crystalline silicon substrate. Within the substrate are a channel region positioned below the vertical stack and source diffusion and drain diffusion on opposing sides of the channel region.

Similar to a floating gate device, a SONOS memory cell, is programmed by inducing hot electron injection from the channel region to the nitride layer to create a non volatile negative charge within charge traps existing in the nitride layer. Again, hot electron injection can be achieved by applying a drain-to-source bias along with a high positive voltage on the control gate. The high voltage on the control gate inverts the channel region while the drain-to-source bias accelerates electrons towards the drain region. The accelerated electrons gain sufficient energy to cross the 3.2 eV Si—SiO2 energy barrier between the channel region and the tunnel oxide. While the electrons are accelerated towards the drain region, those electrons which collide with the crystalline lattice are re-directed towards the Si—SiO2 interface under the influence of the control gate electrical field and have sufficient energy to cross the barrier. Because the nitride layer stores the injected electrons within traps and is otherwise a dielectric, the trapped electrons remain localized within a drain charge storage region that is close to the drain region (or in a source charge storage region that is close to the source region if a source to drain bias is used) from which the electrons were injected. As such, the SONOS device can be used to store two bits of data, one in each of the charge storage regions per cell and are typically referred to as Mirror-BitJ SONOS-type flash memory devices.

Product development efforts in both floating gate and SONOS type memory device technology have focused on reducing cell dimensions and operation voltage, improving operation speed and data retention. As the cell size decreases, the thickness of the dielectric layers in the vertical stack need to decrease as well to maintain proper device operation. As floating gate widths decrease, for example, other device dimensions must also decrease in order to maintain proper device operation. Early semiconductor device scaling techniques involved decreasing all dimensions and voltages by a constant scaling factor, to maintain constant electric fields in the device as the feature size decreased. This approach has given way to more flexible scaling guidelines which account for operating characteristics of short-channel devices. A maximum value of semiconductor device sub-threshold current can be maintained while feature sizes shrink. Any or all of several quantities may be decreased by appropriate amounts including SiO2 layer thickness, operating voltage, depletion width, and junction depth, for example.

Unfortunately, thin SiO2 layers are more susceptible to stress induced leakage current (SILC), particularly SiO2 layers less than 50 Angstroms thick of the intergate dielectric layer. It is probable that even for a relatively low gate voltage of 3V, electrons can pass through such thin SiO2 layers by a quantum mechanical tunneling effect. In this manner, a leakage current may undesirably form between the control gate and the floating gate, adversely affecting the operability of the device. For example, the leakage current increases exponentially for about a two-fold decrease in thickness of a SiO2 layer. The exponential increase in the SiO2 layer leakage current significantly affects the operation of semiconductor devices, particularly with regard to standby power, dissipation, reliability and lifetime.

Another disadvantage of thin SiO2 layers is that a breakdown of the SiO2 layers may also occur at even lower values of gate voltage, as a result of defects in the SiO2 layers. Such defects are unfortunately prevalent in relatively thin SiO2 layers.

Additionally, the deposition of thin SiO2 layers is more difficult to control due to inherent limitations of the deposition process. As devices are produced having layers with thicknesses on the order of a few monolayers, the thickness variation of these layers over a 200-mm or 300-mm silicon wafer is of substantial concern. A variation in thickness of only 1.0 Angstrom could result in changes in the device operating conditions. For example, the electron (or hole) mobility or the device transconductance may be affected. Additionally, variations in layer thickness make it extremely difficult to maintain device tolerances. Further, the layer thicknesses not only vary within a wafer, but also vary from lot-to-lot which affects the manufacturing of wafers.

Therefore, there exists a need in the art for a semiconductor device that has a dielectric layer which prevents or decreases the leakage current between a gate electrode and the semiconductor substrate. In semiconductor devices with multiple gates, there is a need to prevent the leakage current between a floating gate electrode and the semiconductor substrate and/or a control gate. Thus, the semiconductor devices can be further scaled without reducing the data retention of the finished device.

SUMMARY OF THE INVENTION

One promising approach for maintaining the capacitance and thickness of the intergate dielectric layer and/or a stacked ONO gate structure may be to increase the permittivity of the layers in order to Areduce@ an electrical equivalent thickness of the layer(s) of the intergate dielectric layer and/or the stacked ONO gate structure. Permittivity, E, of a material reflects the ability of the material to be polarized by an electric field. The permittivity of a material is typically described as its permittivity normalized to the permittivity of a vacuum, ∈0. Hence, the relative permittivity, referred to as the dielectric constant, of a material is defined as:

$$K = \epsilon/\epsilon_0$$

While SiO2 (sometimes simply referred to as "oxide") has a dielectric constant of approximately 3.9, other materials have higher K values. Silicon nitride ("nitride"), for example, has a K of about 6 to 9 (depending on formation conditions) and aluminum oxide (Al2O3) has a K of about 9 to 10. Much higher K values of, for example, about 20 or more can be obtained with various transition metal oxides including tantalum oxide (Ta2O5), barium strontium titanate ("BST"), and lead zirconate titanate ("PZT").

For example, using a dielectric material with a higher K for one or more of the layers of the intergate dielectric layer and/or the stacked ONO gate structure would allow a high capacitance and an electrical equivalent thickness of a thinner ONO layer to be achieved while maintaining or increasing the physical thickness of the intergate dielectric layer and/or the stacked ONO gate structure. For example, an Al2O3 layer with a K of 9.6 and a physical thickness of 62.5 Angstroms is substantially electrically equivalent to a SiO2 layer (K=3.9) having a physical thickness of 25 Angstroms. Further, a nitride layer with a K of 7.8 and a physical thickness of 50 Angstroms is substantially electrically equivalent to a SiO2 layer having a physical thickness of 25 Angstroms. Thus, an intergate dielectric layer including two Al2O3 layers and a nitride layer of 50 Angstroms each would have an electrical equivalent thickness of 75 Angstroms of SiO2, but have a physical thickness of 175 Angstroms. Therefore, the intergate dielectric layers and/or the stacked ONO gate structure can be made electrically thin while being formed of physically thicker layers compared to conventional ONO layers.

In one embodiment, the present invention relates to a semiconductor device formed on a semiconductor substrate having an active region, the semiconductor device comprising: a gate dielectric layer disposed on the semiconductor substrate, the gate dielectric layer having at least two sub-layers with at least one sub-layer having a dielectric constant greater than SiO2; a floating gate formed on the gate dielectric layer defining a channel interposed between a source and a drain formed within the active region of the semiconductor substrate; a control gate formed above the floating gate; and an intergate dielectric layer interposed between the floating gate and the control gate, the intergate dielectric layer comprising: a first layer formed on the floating gate; a second layer formed on the first layer; and a third layer formed on the second layer, wherein each of the first, second and third layers has a dielectric constant greater than SiO2.

In another embodiment, the present invention relates to a method of fabricating a semiconductor device formed on a semiconductor substrate having an active region, the method comprising the steps of: forming a gate dielectric layer on the semiconductor substrate, the gate dielectric layer having at least two sub-layers with at least one sub-layer having a dielectric constant greater than SiO2; forming a source and a drain within the active region of the semiconductor substrate; forming a floating gate on the gate dielectric layer wherein the floating gate defines a channel interposed between the source and drain; forming a control gate above the floating gate; and forming an intergate dielectric interposed between the floating gate and the control gate, wherein the step of forming the intergate dielectric layer further includes the steps of: forming a first layer on the floating gate; forming a second layer on the first layer; and forming a third layer on the second layer, wherein each of the first, second and third layers have a dielectric constant greater than SiO2.

In another embodiment, the present invention relates to a semiconductor memory device formed on a semiconductor substrate having a barrier layer and an intergate dielectric layer disposed thereon wherein the barrier layer is formed on the semiconductor substrate and the intergate dielectric layer comprises: a first layer formed on the barrier layer; a second layer formed on the first layer; and a third layer formed on the second layer, wherein each of the first, second and third layers have a dielectric constant greater than SiO2 and the barrier layer is formed of a material having a dielectric constant less than the first layer of the intergate dielectric layer.

DETAILED DESCRIPTION

Figure 1:
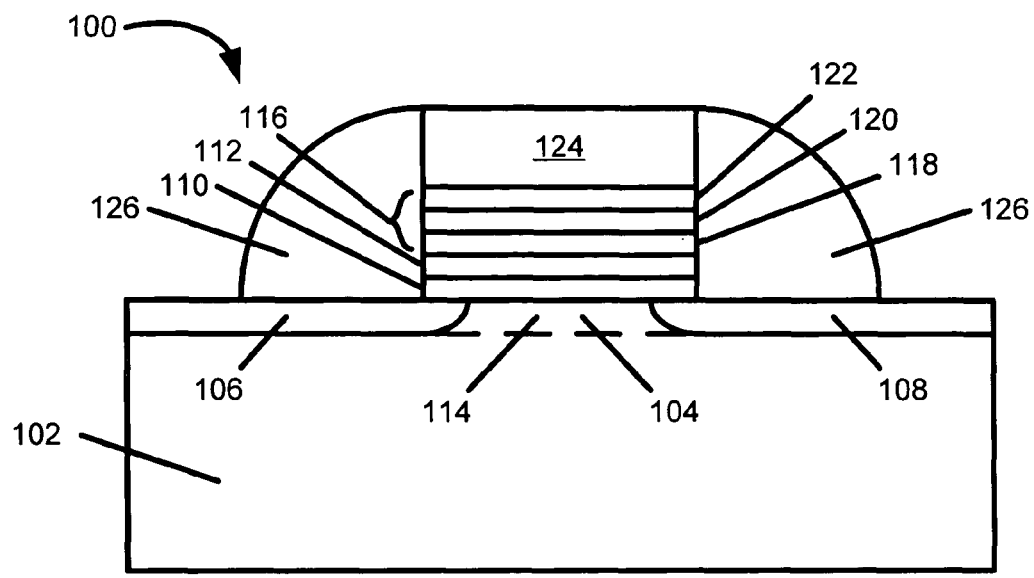
FIG. 1 is a schematic cross-sectional view of a conventional memory device.
Figure 2:
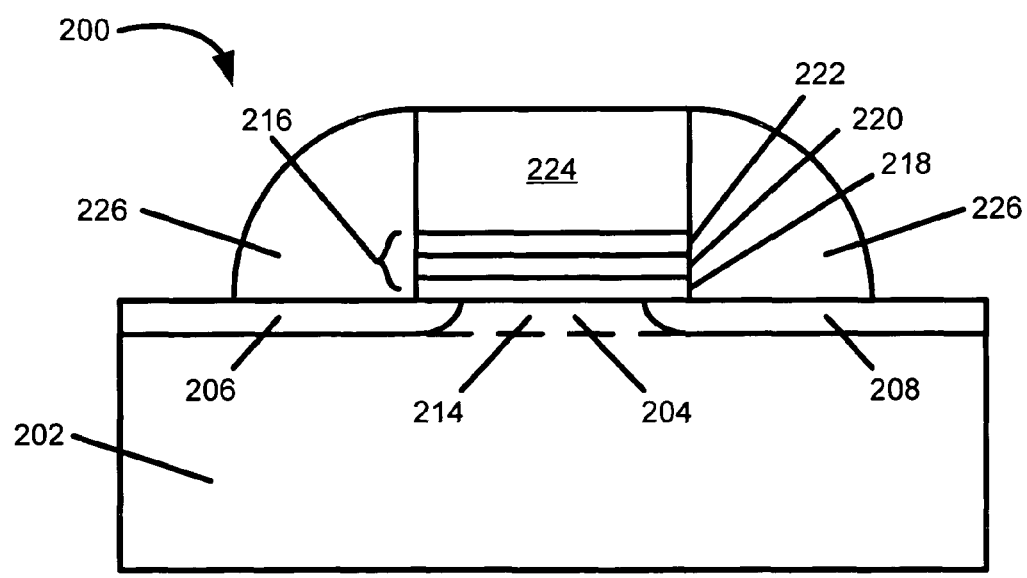
FIG. 2 is a schematic cross-sectional view of a conventional SONOS-type memory device.

As used herein, a "high-K material" or a "high-K dielectric material" refers to a material, or stack of materials, having a relative permittivity in one embodiment of about ten (10) or more, and in another embodiment of about twenty (20) or more. As discussed above, relative permittivity is the ratio of the absolute permittivity ($\in$) found by measuring capacitance of the material to the permittivity of free space ($\in_o$), that is $K=\in/\in_o$. High-K materials will be described in greater detail below. Although other materials can be selected for incorporation into the ONO structure of the present invention, hafnium oxide (e.g., HfO2), zirconium oxide (e.g., ZrO2), cerium oxide (e.g., CeO2), aluminum oxide (e.g., Al2O3), titanium oxide (e.g., TiO2) and yttrium oxide (e.g., Y2O3) are examples of suitable materials for inclusion as discussed below in the ONO structure of the present invention. In addition, all binary and ternary metal oxides and ferroelectric materials having a K higher than, in one embodiment, about twenty (20) can be used in the present invention.

As used herein, the term "standard-K dielectric material" or "standard-K material" refers to a dielectric material having a relative permittivity, or K, of up to about ten (10). Standard-K materials include, for example, silicon dioxide (K of about 3.9), silicon oxynitride (K of about 4 to 8 depending on the relative content of oxygen and nitrogen) and silicon nitride (K of about 6 to 9).

When a high-K material is utilized as the bottom layer in the ONO structure of the present invention, the high-K material can have a physical thickness of 200 Angstroms or more but an equivalent oxide thickness (EOT) of about 100 Angstroms or less, or about 50 Angstroms or less, or even about 40 Angstroms or less. A high-K dielectric allows for the establishment of a suitable capacitance with a physically thicker insulating layer. In addition, devices fabricated with a high-K dielectric layer tend to have improved reliability.

Approximate K-values or, in some cases, a range of K-values, are shown below in Table 1 for several exemplary dielectric materials. It is understood that the present invention is not limited to the specific dielectric materials disclosed herein, but may include any appropriate standard-K and high-K dielectric materials which are known and are compatible with the remaining elements of the semiconductor device with which the dielectric materials are to be used.

TABLE 1

| Dielectric Material | Approximate Relative Permittivity (K) |
|---|---|
| aluminum oxide (Al2O3) | 9 to 12 |
| zirconium silicate | 12 |
| hafnium silicate | 15 |
| hafnium silicon oxynitride | 16 |
| hafnium silicon nitride | 18 |
| lanthanum oxide (La2O3) | 20 to 30 |
| hafnium oxide (HfO2) | 40 |
| zirconium oxide (ZrO2) | 25 |
| cerium oxide (CeO2) | 26 |
| bismuth silicon oxide (Bi4Si2O12) | 35 to 75 |
| titanium dioxide (TiO2) | 30 |
| tantalum oxide (Ta2O5) | 26 |
| tungsten oxide (WO3) | 42 |
| yttrium oxide (Y2O3) | 20 |
| lanthanum aluminum oxide (LaAlO3) | 25 |
| barium strontium titanate (Ba1-xSrxTiO3) | ~20 to ~200 |
| barium strontium oxide (Ba1-xSrxO3) | ~20 to ~200 |
| PbTiO3 | ~20 to ~200 |
| barium titanate (BaTiO3) | ~20 to ~200 |
| strontium titanate (SrTiO3) | ~20 to ~200 |
| PbZrO3 | ~20 to ~200 |
| PST (PbScxTa1-xO3) | 3000 |
| PZN (PbZnxNb1-xO3) | ~500 to ~5000 |
| PZT (PbZrxTi1-xO3) | ~150 to ~1000 |
| PMN (PbMgxNb1-xO3) | ~500 to ~5000 |

It is noted that the K-values, or relative permittivity, for both standard-K and high-K dielectric materials may vary to some degree depending on the exact nature of the dielectric material and on the process used to deposit the material. Thus, for example, differences in purity, crystallinity and stoichiometry, may give rise to variations in the exact K-value determined for any particular dielectric material.

As used herein, when a material is referred to by a specific chemical name or formula, the material may include non-stoichiometric variations of the stoichiometrically exact formula identified by the chemical name. For example, tantalum oxide, when stoichiometrically exact, has the chemical formula Ta2O5. As used herein, the term "tantalum oxide" may include variants of stoichiometric Ta2O5, which may be referred to as TaxOy, in which either of x or y vary by a small amount. For example, in one embodiment, x may vary from about 1.5 to 2.5, and y may vary from about 4.5 to about 5.5. In another embodiment, x may vary from about 1.75 to 2.25, and y may vary from about 4 to about 6. Such variations from the exact stoichiometric formula fall within the definition of tantalum oxide. Similar variations from exact stoichiometry are included when the chemical formula for a compound is used. For example, again using tantalum oxide as an example, when the formula Ta2O5 is used, TaxOy as defined above, is included within the meaning. Thus, in the present disclosure, exact stoichiometry is intended only when such is explicitly so stated. As will be understood by those of skill in the art, such variations may occur naturally, or may be sought and controlled by selection and control of the conditions under which materials are formed.

Here and in all numerical values in the specification and claims, the limits of the ranges and ratios may be combined.

Memory Devices

In the detailed description that follows, identical components have been given the same reference numerals, regardless of whether they are shown in different embodiments of the present invention. To illustrate the present invention in a clear and concise manner, the drawings may not necessarily be to scale and certain features may be shown in somewhat schematic form.

The present invention is described herein below in terms of a common semiconductor device, specifically, a FLASH memory cell formed on a semiconductor substrate (FIG. 3) and a SONOS-type FLASH memory device (FIG. 10), such as the Mirror-BitJ SONOS-type FLASH memory device available from AMD. The present invention is not limited to this illustrative embodiment, however, and may be applied to any semiconductor device in which a dielectric layer is needed, for example, as a gate dielectric in a FET, as an intergate dielectric layer in a floating gate EEPROM FLASH memory device, or the ONO layer in a SONOS-type FLASH memory device. Thus, it is to be understood that the present invention is not limited to the specific illustrative embodiments described below.

Figure 3:
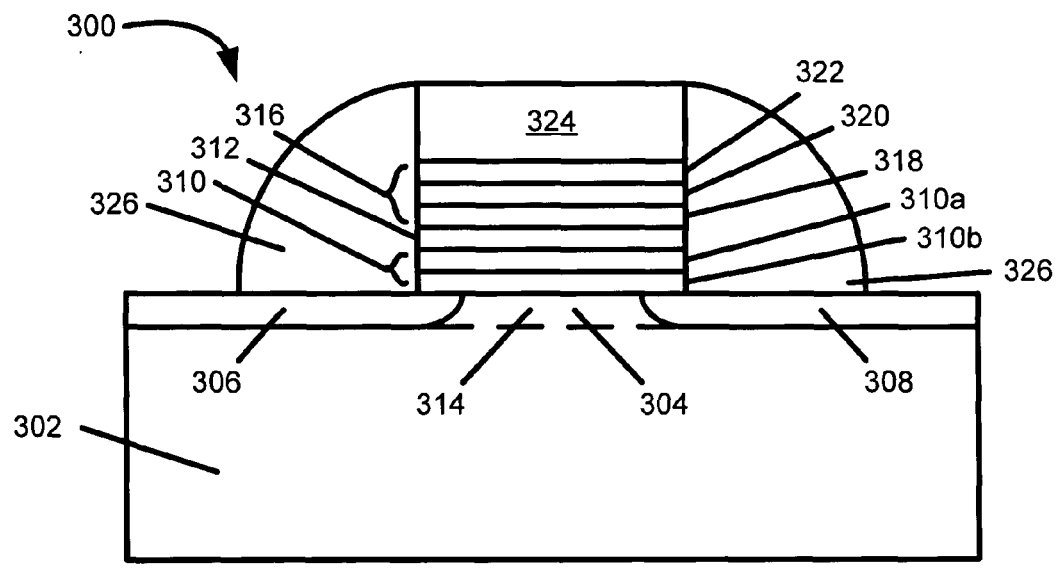
FIG. 3 is a schematic cross-sectional view of a memory device according to one embodiment of the present invention.

As shown in FIG. 3, FIG. 3 illustrates, in cross-section, a floating-gate transistor 300 according to one embodiment of the present invention. In the device of FIG. 3, a floating-gate transistor 300 includes a semiconductor substrate 302 having an active region 304. A source 306 and a drain 308 are formed in the active region 304. A gate dielectric 310 containing at least one standard-K layer and at least one high-K layer is formed on the semiconductor substrate 302. A floating gate 312 is formed on the gate dielectric 310. The floating gate 312 defines the channel 314 between the source 306 and the drain 308. An intergate dielectric layer 316 is formed on the floating gate 312. In one embodiment, the intergate dielectric layer 316 includes therein three layers which form an ONO structure.

In the ONO structure of the intergate dielectric layer 316, a first layer 318 of high-K material (e.g., Al2O3) is formed on the floating gate 312, a second layer 320 formed of a suitable material having a dielectric constant higher than that of SiO2 (e.g., silicon nitride or a suitable high-K material) is formed on the first layer 318, and a third layer 322, also a high-K layer, is formed on the second layer 320. A control gate 324 is formed on the ONO structure of the intergate dielectric layer 316. The gate dielectric 310, the floating gate 312, the intergate dielectric layer 316, and the control gate 324 form a vertical stack characteristic of a FLASH memory cell. Spacers 326 are formed on the sidewalls of the vertical stack. Isolation techniques that are known in the art may be used to electrically isolate the semiconductor device 300 from other semiconductor devices.

As used herein and in the claims, the term AONO structure@ refers to multi-layered structures which have at least a first layer which may or may not contain oxygen, a second layer which is formed from suitable charge storage layer material, which may or may not contain nitrogen, and a third layer which may or may not contain oxygen. At least one of the first, second or third layers has a dielectric constant which is higher than that of SiO2.

In one embodiment, the semiconductor substrate 302 is a bulk silicon semiconductor substrate. In one embodiment, the semiconductor substrate 302 is a silicon-on-insulator semiconductor substrate. In another embodiment, the semiconductor substrate 302 is a p-doped silicon semiconductor substrate. Suitable semiconductor substrates include, for example, bulk silicon semiconductor substrates, silicon-on-insulator (SOI) semiconductor substrates, silicon-on-sapphire (SOS) semiconductor substrates, and semiconductor substrates formed of other materials known in the art. The present invention is not limited to any particular type of semiconductor substrate.

The active region 304 may be a p-type region or an n-type region formed in the semiconductor substrate 302. The active region 304 may be pre-doped prior to the manufacture of the floating gate 312 of the semiconductor device 300. The active region 304 may be doped with p-type dopings for n-type channel devices and/or n-type dopings for p-type channel devices. The active region 304 may have a thickness of between about 800 and about 1000 Angstroms.

The source 306 and the drain 308 may be two N+ regions formed in the active region 304 of the semiconductor substrate 302. Alternatively, the source 306 and the drain 308 may be two P+ regions. In one embodiment, as is illustrated in FIG. 3, the source 306 and the drain 308 are shown as respective deep implant regions. However, it should be understood that shallow extension regions could also be formed extending from the respective deep implant regions.

The gate dielectric 310 interposed between the floating gate 312 and the semiconductor substrate 302 is shown as a bi-layer dielectric. The gate dielectric 310 is made of at least one layer of a standard-K gate dielectric material including SiO2 and at least one high-K dielectric layer. In one embodiment, the gate dielectric 310 is made of a bottom layer 310a of SiO2 and a high-K layer 310b of Al2O3. The gate dielectric 310 may have a thickness of, for example, between about 50 and about 100 Angstroms. This use of a combination of standard-K and high-K layers for the gate dielectric layer permits devices made in accordance with the present invention to have gate dielectric layers which are electrically thinner than similar devices containing a gate dielectric formed of a single layer of standard-K material.

It should be understood by those skilled in the art that the gate dielectric 310 could be a multi-layer dielectric. For example, a layer of SiO2 may be deposited on the semiconductor substrate 302 followed by a layer of Al2O3, followed by another layer of SiO2. Alternatively, a layer of high-K material may be deposited on the semiconductor substrate 302 followed by a layer of SiO2 deposited on the high-K material. For example, the gate dielectric 310 of FIG. 3 may be made of a bottom layer 310a of high-K material and a second layer 310b of SiO2.

Any high-K material that has a K value which is higher than 10, or even higher than 20, can be used in the gate dielectric of the present invention. Examples of suitable compounds for the at least one high-K layer contained in the gate dielectric of the present invention are discussed above and are shown in Table 1.

The floating gate 312 may be made of p-type polysilicon. In one embodiment, the floating gate 312 may be made of typical, well-known gate electrode materials, for example, n-type polysilicon, when the control gate 324 is made of p-type polysilicon. The exemplary floating gate 312 may have a thickness of between about 100 and about 300 Angstroms.

The channel 314 may be a p-type region interposed between the source 306 and the drain 308. Alternatively, an n-type channel could be interposed between two P+ regions.

As is noted above, the intergate dielectric layer 316 is disposed on the floating gate 312. The intergate dielectric layer 316 may be made of alternating layers of high-K dielectric materials as described below. The first layer 318 may be made of Al2O3 or may be made of another high-K dielectric material described above. The first layer 318 may have a thickness of, for example, between about 30 and about 50 Angstroms. The second layer 320 may be made of any material having a dielectric constant greater than that of SiO2 (e.g., silicon nitride or any suitable high-K material). The second layer 320 may have a thickness of between about 30 and about 50 Angstroms. The third layer 322 may be made of the same material as the first layer 318 or may be made of another dielectric material having a dielectric constant greater than that of SiO2. The third layer 322 may have a thickness of between about 30 and about 50 Angstroms.

In another embodiment, the intergate dielectric layer 316 is made of a single layer of a high-K dielectric material as described below. The intergate dielectric layer 316 may be made of Al2O3 or may be made of another high-K dielectric material described below. In one embodiment, the intergate dielectric layer 316 has a physical thickness less than a conventional ONO layer. In such case, the intergate dielectric layer 316 may have an electrical equivalent thickness significantly less than the conventional ONO layer as will be further described below. The dielectric material may be, for example, Al2O3. Al2O3 has a dielectric constant of approximately 9.6 or approximately 2.5 times that of SiO2 (K=3.9). Therefore, the intergate dielectric layer 316 may be formed to a physical thickness of about 75 Angstroms. Such an intergate dielectric layer would have an electrical thickness equivalent of about 25 Angstroms of SiO2.

On top of the intergate dielectric layer 316 is the control gate 324. The control gate 324 may be made of p-type polysilicon or n-type polysilicon. The control gate 324 may have a thickness of between about 1000 and about 3000 Angstroms.

The spacers 326 are made of a dielectric material. The dielectric material may be SixNy, SiOxNy, Al2O3, or may be made of another high-K dielectric material described below. The spacers 326 may have total heights between about 400 and about 1200 Angstroms. Further, the spacers 326 are shown as single layer spacers. However, the spacers 326 could be multi-layer spacers.

Not shown in FIG. 3 are additional parts of the working semiconductor device 300, such as electrical conductors, protective coatings and other parts of the structure which would be included in a complete, working semiconductor device. These additional parts are not necessary to the present invention, and for simplicity and brevity are neither shown nor described. Nevertheless, how such parts could be added will be easily understood by those of skill in the art.

The method of making the semiconductor device 300 is now described in detail with reference to FIGS. 3 to 9. FIG. 9 is a flow diagram schematically presenting the steps of making the semiconductor device 300 of the present invention.

Figure 4:
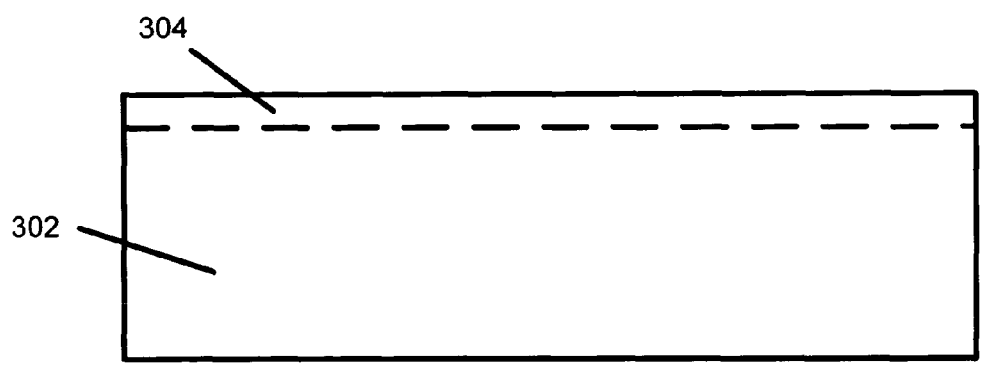
FIGS. 4 to 8 are cross-sectional views of select steps in the manufacturing process of a memory device according to one embodiment of the present invention.

In the first step of the method of the present invention, shown in FIG. 9 as Step S101, the semiconductor substrate 302 is provided, as shown in FIG. 4. The semiconductor substrate 302 may be any appropriately selected semiconductor substrate known in the art, as described above. The semiconductor substrate 302 may be subjected to implants to provide the active region 304 in the semiconductor substrate 302 as is known in the art. For instance, boron or indium may be implanted to form a p-type region or channel for an n-type device and phosphorous or arsenic may be implanted to form an n-type region or channel for a p-type device. An exemplary range of concentration of these dopings is between about $1 \times 10^{18}$ and about $5 \times 10^{20}$ atoms/cm3 for the p-type channel 314.

Figure 5:
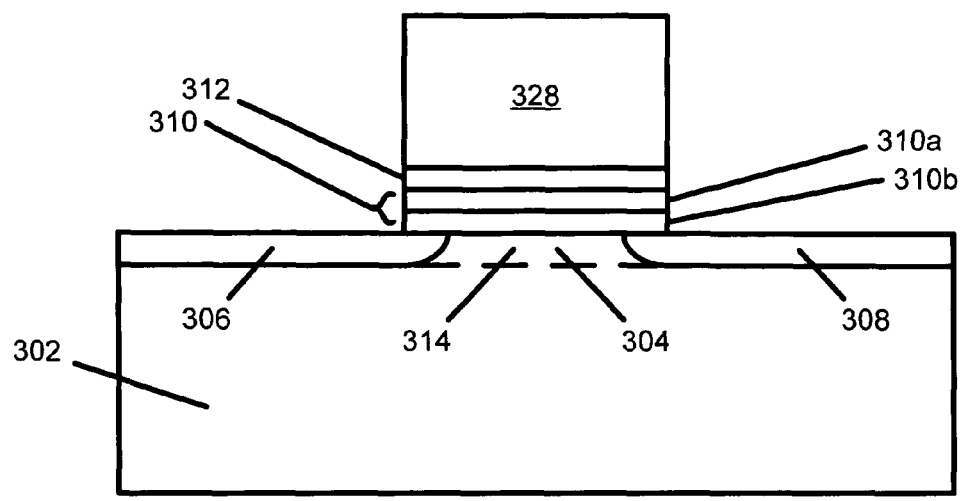

Now referring to FIG. 5 and Step S102, the two or more layers of the gate dielectric 310 are formed on the semiconductor substrate 302. As is noted above, the first layer may be either a standard-K layer of a high-K layer. For example, when layer 310a is a standard-K layer, layer 310a may be SiO2 which is thermally grown or deposited on the semiconductor substrate to a thickness of between about 10 and about 30 Angstroms. Next, layer 310b of the gate dielectric 310 is formed on layer 310a. When layer 310b is a high-K layer, layer 310b is formed to have a thickness of between about 40 and about 70 Angstroms. As is noted above, the materials utilized to form layers 310a and 310b can be reversed. That is, a layer of high-K material can be deposited first followed by a layer of standard-K material.

Then, the floating gate 312 is formed on the gate dielectric 310. Initially, an undoped layer of polysilicon may be deposited on the gate dielectric 310. Next, the polysilicon layer is patterned and etched to form the floating gate 312. Following the formation of the floating gate 312, an implantation step may be done at this time to implant the polysilicon of the floating gate 312. The polysilicon layer may be N+ or P+ doped.

Next, the nitride layer 328 is formed on the floating gate 312. The nitride layer 328 may be formed by a LPCVD process, for example. The nitride layer 328 would be deposited and patterned in order to protect the floating gate 312 from, for example, boron penetration, during an implant to form the source 306 and the drain 308.

Next, the semiconductor substrate 302 may be subjected to implants to produce the source 306 and the drain 308. The source 306 and the drain 308 may be formed by a main perpendicular implant. The main perpendicular implant is a relatively high energy, high concentration implant which is capable of producing the source 306 and the drain 308. Either boron, arsenic, or phosphorous may be used alone or in any combination as the dopant atoms. An exemplary range of implant dose of the perpendicular implant is between about $1 \times 10^{15}$ and about $2 \times 10^{15}$ atoms/cm2. An exemplary range of concentration of these dopings is between about $1 \times 10^{20}$ and about $2 \times 10^{20}$ atoms/cm3 for the source 306 and the drain 308. The dopants may be selected from other dopant materials known in the art.

Although the source 306 and the drain 308 are shown as main implantation regions, it should be understood that extension implantation may be done in order to form extension regions as is known in the art. It should also be understood that the formation of the source 306 and the drain 308 may take place before the formation of the floating gate 312 or after the formation of the FLASH memory vertical stack.

Figure 6:
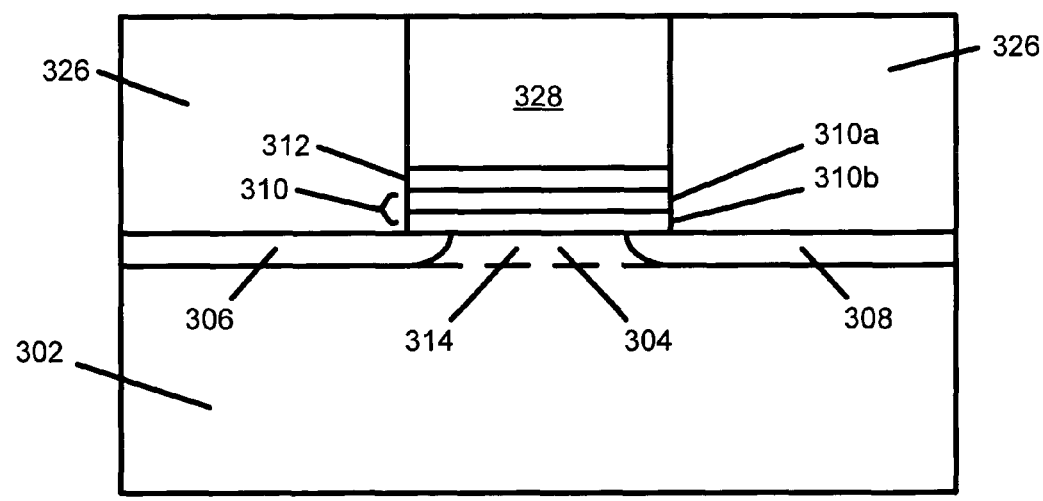

Now referring to FIG. 6, a spacer layer 326 is deposited on the semiconductor substrate 302 and the nitride topped gate. The spacer layer 326 reaches between about 500 and about 1000 Angstroms above the nitride layer 328 of the nitride topped gate. Next, the spacer layer 326 is polished back to the top surface of the nitride layer 328 of the nitride topped gate. The polishing is done using conventional techniques, which are well-known in the art. The spacer layer 326 may be a TEOS layer or other spacer material known to those skilled in the art.

In the third step of the method of the present invention, shown in FIG. 9 as Step S103, an etch of hot phosphoric acid is performed on the nitride layer 328 down to the floating gate 312. Thus, all of the nitride layer 328 is removed to leave an upper surface of the floating gate 312 exposed. It should be appreciated that other suitable selective etching methods well-known in the art may be used.

Figure 7:
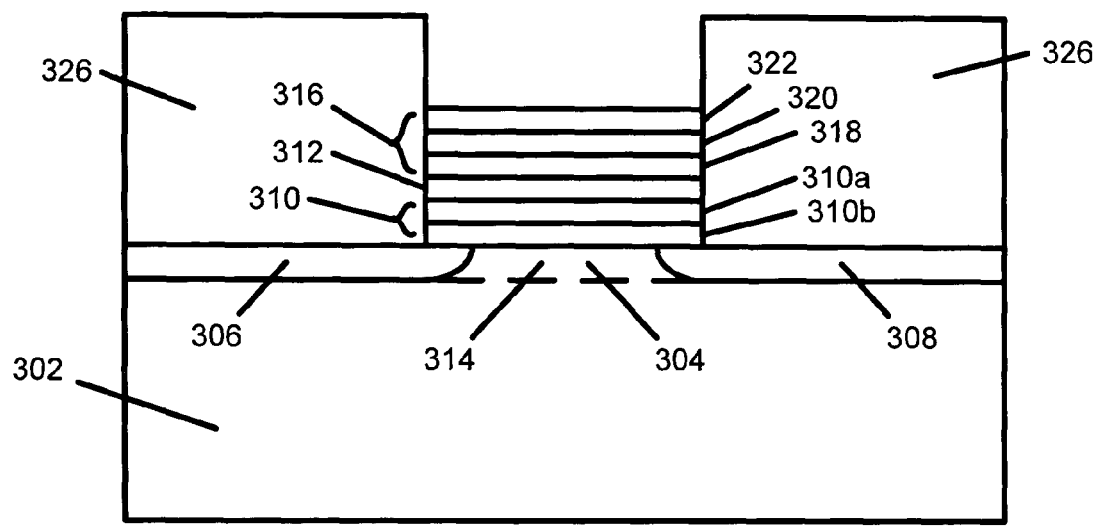

With reference to FIG. 7, the intergate dielectric layer 316 of high-K dielectric materials (as described above) is formed on the floating gate 312. Specifically, layers 318, 320 and 322 of alternating high-K dielectric materials are formed on the floating gate 312 in an opening defined by the spacer layer 324 using techniques described below. In one embodiment, the first layer 318 and the third layer 322 are of Al2O3. The second layer 320 is nitride.

In the embodiment in which aluminum oxide and nitride are the first and second dielectric materials, the aluminum is supplied in the form of an aluminum-containing gas such as aluminum chloride; the nitride is supplied in the form of ammonia gas, NH3; and the oxygen is supplied in the gaseous form. Since the first layer 318 is to be aluminum oxide, the aluminum-containing gas and the oxygen are first provided to the CVD apparatus. When a suitable thickness of aluminum oxide has been deposited, the flow of the aluminum-containing gas is stopped, and a flow of NH3 gas is provided to the CVD apparatus. When a suitable thickness of nitride has been deposited, the flow of the NH3 gas is stopped, and the flow of aluminum-containing gas is started again, together with the oxygen gas, and continued until a suitable thickness of aluminum oxide is deposited. This process of alternating layer deposition may be continued until a suitable, selected number of layers of desired thickness has been deposited. In one embodiment, three layers are deposited.

In one embodiment an ALD process is used to deposit one or more layers of dielectric material. In an exemplary ALD process, sequential deposition of a precursor, a purge gas and a co-reactant are introduced into an ALD chamber as a series of pulses. A complete cycle includes the following sequence: precursor/inert purge/co-reactant/inert purge, for example. The completion of one cycle results in the deposition of about 0.01 to about 1.0 monolayer of a metal-containing layer on the surface of the semiconductor substrate 302. The above monolayer range corresponds to a layer thickness of about 0.2 Angstroms. A preferred deposition temperature is from about 2001 C to about 4001 C. The precursors may be the metal nitrate of any of the target metals of the high-K dielectric materials described above, for example, Al(NO3)x. The inert gases employed in the present invention include the use of inert gases such as He, Ar, N2 and other like gases. The pulse duration of the precursor, the co-reactant and the inert gas may be from about 0.1 to about 5 seconds. The co-reactants are conventional oxidizing agents, nitride agents and reducing agents that are typically employed in ALD processes.

In the embodiment where the intergate dielectric layer 316 is to be Al2O3, the precursor may be aluminum nitrate and the oxidant may be water. The precursor, reactant and an inert purge gas may be pulsed using the following sequence:

1. Aluminum Nitrate B 0.5 seconds
2. Inert Purge B 2.0 seconds
3. Water B 0.5 seconds
4. Inert Purge B 2.0 seconds Twenty (20) cycles may be used in providing an aluminum oxide layer having a thickness of about 20 Angstroms. The use of ALD allows for the formation of layers which have atomically abrupt interfaces, excellent uniformity and fine thickness control. Further, ALD enables deposition of layers inside small vias and trenches with precise coverage.

The intergate dielectric layer 316 results from the above formation of alternate layers. It should be understood the third step, S103, can be broken down into a series of steps in which each of the alternating layers 318, 320 and 322 are deposited in a separate apparatus. Alternatively, the second layer 320 (i.e., the nitride layer 328) could be deposited using a conventional RTA technique. The resulting intermediate semiconductor device is shown in FIG. 7.

Figure 8:
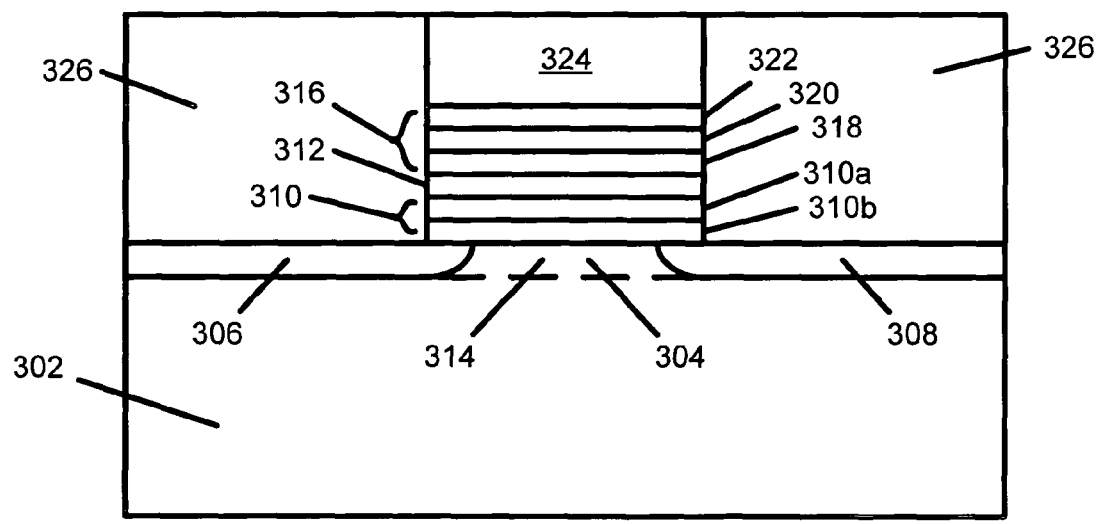
Figure 9:
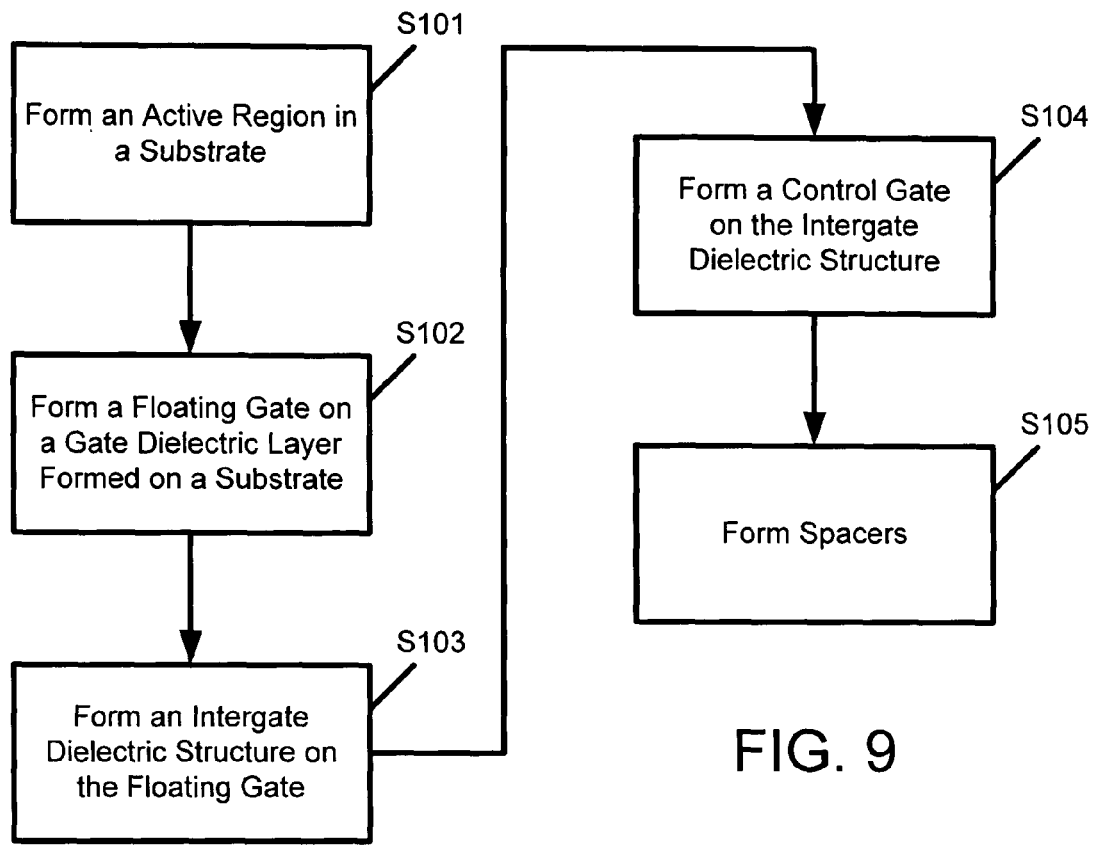
FIG. 9 is a schematic flow diagram showing the basic steps in a process for making a memory device according to one embodiment of the present invention.

Now referring to FIG. 8 and Step S104, an undoped polysilicon layer 324 is deposited on the intergate dielectric layer 316 through the opening defined by the spacer layer 326. The undoped polysilicon layer 324 is deposited between about 1000 and about 3000 Angstroms above the upper surface of the spacer layer 326. Next, the undoped polysilicon layer 324 is polished back to be even with the upper surface of the spacer layer 326. The polishing is done using conventional techniques, which are well-known in the art. The polysilicon may be N+ or P+ pre-doped or an implantation step may be done at this time to implant the polysilicon. An exemplary range of concentration of dopings is between about 1×1018 and about 5×1020 atoms/cm3 for the control gate 324.

Subsequently, connections such as word lines may be formed using conventional techniques in order to establish electrical connections between the semiconductor device 300 and other nodes (such as an I/O pad or Vss), the source 306 or the drain 308 of the device as well as a power supply or a ground, if desired. The formation of the connections are not shown.

Next in Step S105, the spacer layer 326 is anisotropically etched with a suitable etchant. The spacer layer 326 is etched down to expose the top of the control gate 324 and the lateral surface of the semiconductor substrate 302, leaving the spacers 326 shown in FIG. 3. The spacers 326 may extend from the surface of the semiconductor substrate 302 to a height of between about 400 and about 1200 Angstroms.

After formation of the spacers 326, the semiconductor device 300 may be subjected to rapid thermal annealing (RTA). Exemplary RTA may be performed for between about 5 and about 15 seconds at a temperature of about 1020 to about 10501 C.

The present invention enables further device scaling without adverse impact on device performance. In addition, the present invention improves deposition precision uniformity, thickness, abrupt atomic interfaces, etc., by enabling deposition of the intergate dielectric layer 316 (ONO layer) by an ALD process. Due to the inherent limitations of the CVD process, the control of oxide layer thickness becomes more difficult as dimensions shrink. By enabling a thinner and more accurately deposited oxide layer to be used as the intergate dielectric layer 316, the methodology of the present invention facilitates cost-effective device scaling and allows greater flexibility in oxide deposition. Additionally, the intergate dielectric layer 316 with a relatively high-K electrical equivalence improves the device operation.

Figure 10:
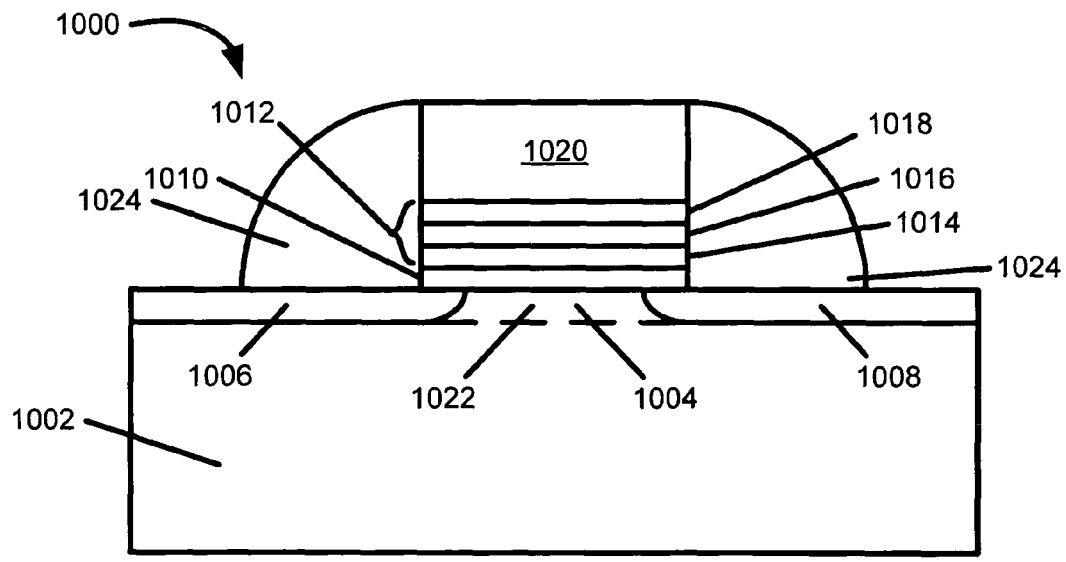
FIG. 10 is a schematic cross-sectional view of a SONOS-type memory device according to one embodiment of the present invention.

FIG. 10 shows an illustrative embodiment of a SONOS-type FLASH memory device of the present invention generally designated as 1000. The semiconductor device 1000 comprises a semiconductor substrate 1002 having an active region 1004. A source 1006 and a drain 1008 are formed in the active region 1004. A barrier layer 1010 of a standard-K dielectric material (e.g., SiO2) is formed on the semiconductor substrate 1002. An intergate dielectric layer 1012 is formed on the barrier layer 1010. The intergate dielectric layer 1012 comprises a nitride layer interposed between layers of high-K dielectric material. In this embodiment, the intergate dielectric layer 1012 is comprised of three layers. A first layer 1014 is formed on the barrier layer 1010. A second layer 1016 is formed on the first layer 1014. In one embodiment of this device, the second layer 1016 acts as the charge storing layer. A third layer 1018 is formed on the second layer 1016. A control gate 1020 is formed on the intergate dielectric layer 1012. The control gate 1020 defines the channel 1022 between the source 1006 and the drain 1008. The intergate dielectric layer 1012, and the control gate 1020 form a vertical stack characteristic of a SONOS FLASH memory cell. Spacers 1024 are formed on the sidewalls of the vertical stack. Isolation techniques that are known in the art may be used to electrically isolate the semiconductor device 1000 from other semiconductor devices.

The intergate dielectric layer 1012 is disposed on the barrier layer 1014. The intergate dielectric layer 1012 may be made of a nitride layer interposed between layers of high-K dielectric material as described above. The first layer 1014 may be made of Al2O3 or may be made of another high-K dielectric material described above. The first layer 1014 may have a thickness of, for example, between about 30 and about 50 Angstroms. The second layer 1016 may be made of nitride material, for example, SixNy, SiOxNy or the like. The second layer 1016 may have a thickness of between about 30 and about 50 Angstroms. The third layer 1018 may be made of the same high-K material as the first layer 1018 or may be made of another dielectric material having a dielectric constant greater than that of SiO2. The third layer 1018 may have a thickness of between about 30 and about 50 Angstroms.

In one embodiment, the intergate dielectric layer 1012 has a physical thickness less than or equal to a conventional ONO layer. In such case, the intergate dielectric layer 1012 may have an electrical equivalent thickness significantly less than the conventional ONO layer. In one embodiment, the intergate dielectric layer 1012 of high-K dielectric material may have a physical thickness greater than a conventional ONO layer. However, the intergate dielectric layer has an electrical equivalent thickness of an ONO layer having equal or thinner SiO2 layers.

On top of the intergate dielectric layer 1012 is the control gate 1020. The control gate 1020 may be made of p-type polysilicon. The exemplary control gate 1020 may have a thickness of between about 1000 and about 3000 angstroms.

In accordance with the present invention, the size of a memory device can be reduced, in one case by at least 10 percent, or at least 20 percent, or even by about 30 percent. In other words, the length and width of a channel region in a memory device according to the present invention can be reduced by at least 10 percent, or at least 20 percent, or even by about 30 percent, due to the inclusion of a gate dielectric containing at least two layers, one of which is a high-K layer, and an @ONO structure@ in accordance with the present invention. Alternatively, in the case of SONOS-type FLASH memory devices, the above-mentioned size reduction may be achieved by the inclusion of a barrier layer in conjunction with an @ONO structure@ in accordance with the present invention. Due to the present invention, the size of a channel region in a memory device can be reduced.

Although the invention has been described and illustrated with reference to specific illustrative embodiments thereof, it is not intended that the invention be limited to those illustrative embodiments. Those skilled in the art will recognize that variations and modifications can be made without departing from the spirit of the invention. For example, the thicknesses of the individual layers making up the AONO structure@ can be varied from that described herein. It is therefore intended to include within the invention all such variations and modifications that fall within the scope of the appended claims and equivalents thereof.

What is claimed is:

1. A method of fabricating a semiconductor device formed on a semiconductor substrate having an active region, the method comprising the steps of:

forming a gate dielectric layer on the semiconductor substrate, the gate dielectric layer comprising a first dielectric layer with a dielectric constant greater than SiO$_2$ and a second dielectric layer with a dielectric constant equal to SiO2, wherein the first dielectric layer directly contacts the semiconductor substrate, and wherein the second dielectric layer directly contacts the first dielectric layer;

forming a source and a drain within the active region of the semiconductor substrate;

forming a floating gate on the gate dielectric layer wherein the floating gate defines a channel interposed between the source and drain;

forming a control gate above the floating gate; and forming an intergate dielectric layer interposed between the floating gate and the control gate, wherein the step of forming the intergate dielectric layer further includes the steps of:

forming a first layer on the floating gate;

forming a second layer on the first layer; and forming a third layer on the second layer, wherein each of the first, second and third layers have a dielectric constant greater than SiO$_2$.

2. The method according to claim 1, wherein each of the layers of the intergate dielectric layer are formed to have an electrical equivalent thickness of less than about 50 Angstroms of SiO$_2$.

3. The method according to claim 1, wherein a first layer material is formed comprising one or more of aluminum oxide, zirconium silicate, hafnium silicate, hafnium silicon oxynitride, hafnium silicon nitride, lanthanum oxide, hafnium oxide, zirconium oxide, cerium oxide, bismuth silicon oxide, titanium dioxide, tantalum oxide, tungsten oxide, yttrium oxide, lanthanum aluminum oxide, barium strontium titanate (Ba$_{1-x}$Sr$_x$TiO$_3$), barium strontium oxide (Ba$_{1-x}$Sr$_x$O$_3$), PbTiO$_3$, barium titanate, strontium titanate, PbZrO$_3$, PST (PbSc$_x$Ta$_{1-x}$O$_3$), PZN (PbZn$_x$Nb$_{1-x}$O$_3$), PZT (PbZr$_x$Ti$_{1-x}$O$_3$), PMN (PbMg$_x$Nb$_{1-x}$O$_3$).

4. The method according to claim 3, wherein the first layer is formed of Al$_2$O$_3$.

5. The method according to claim 1, wherein a third layer material is formed comprising one or more of aluminum oxide, zirconium silicate, hafnium silicate, hafnium silicon oxynitride, hafnium silicon nitride, lanthanum oxide, hafnium oxide, zirconium oxide, cerium oxide, bismuth silicon oxide, titanium dioxide, tantalum oxide, tungsten oxide, yttrium oxide, lanthanum aluminum oxide, barium strontium titanate (Ba$_{1-x}$Sr$_x$TiO$_3$), barium strontium oxide (Ba$_{1-x}$Sr$_x$O$_3$), PbTiO$_3$, barium titanate, strontium titanate, PbZrO$_3$, PST (PbSc$_x$Ta$_{1-x}$O$_3$), PZN (PbZn$_x$Nb$_{1-x}$O$_3$), PZT (PbZr$_x$Ti$_{1-x}$O$_3$), PMN (PbMg$_x$Nb$_{1-x}$O$_3$).

6. The method according to claim 5, wherein the third layer is formed of Al$_2$O$_3$.

7. The method according to claim 1, wherein the first and third layers each are formed having a dielectric constant greater than the dielectric constant of the second layer.

8. The method according to claim 1, wherein the first and third layers each are formed comprising one or more of aluminum oxide, zirconium silicate, hafnium silicate, hafnium silicon oxynitride, hafnium silicon nitride, lanthanum oxide, hafnium oxide, zirconium oxide, cerium oxide, bismuth silicon oxide, titanium dioxide, tantalum oxide, tungsten oxide, yttrium oxide, lanthanum aluminum oxide, barium strontium titanate (Ba$_{1-x}$Sr$_x$TiO$_3$), barium strontium oxide (Ba$_{1-x}$Sr$_x$O$_3$), PbTiO$_3$, barium titanate, strontium titanate, PbZrO$_3$, PST (PbSc$_x$Ta$_{1-x}$O$_3$), PZN (PbZn$_x$Nb$_{1-x}$O$_3$), PZT (PbZr$_x$Ti$_{1-x}$O$_3$), PMN (PbMg$_x$Nb$_{1-x}$O$_3$).

9. The method according to claim 8, wherein the first and third layers are formed of Al$_2$O$_3$.

10. The method according to claim 9, wherein the second layer is formed of a nitride layer.

11. The method according to claim 1, wherein a second layer material is formed comprising one or more of aluminum oxide, zirconium silicate, hafnium silicate, hafnium silicon oxynitride, hafnium silicon nitride, lanthanum oxide, hafnium oxide, zirconium oxide, cerium oxide, bismuth silicon oxide, titanium dioxide, tantalum oxide, tungsten oxide, yttrium oxide, lanthanum aluminum oxide, barium strontium titanate (Ba$_{1-x}$Sr$_x$TiO$_3$), barium strontium oxide (Ba$_{1-x}$Sr$_x$O$_3$), PbTiO$_3$, barium titanate, strontium titanate, PbZrO$_3$, PST (PbSc$_x$Ta$_{1-x}$O$_3$), PZN (PbZn$_x$Nb$_{1-x}$O$_3$), PZT (PbZr$_x$Ti$_{1-x}$O$_3$), PMN (PbMg$_x$Nb$_{1-x}$O$_3$).

12. The method according to claim 8, wherein the second layer is formed comprising one or more of aluminum oxide, zirconium silicate, hafnium silicate, hafnium silicon oxynitride, hafnium silicon nitride, lanthanum oxide, hafnium oxide, zirconium oxide, cerium oxide, bismuth silicon oxide, titanium dioxide, tantalum oxide, tungsten oxide, yttrium oxide, lanthanum aluminum oxide, barium strontium titanate (Ba$_{1-x}$Sr$_x$TiO$_3$), barium strontium oxide (Ba$_{1-x}$Sr$_x$O$_3$), PbTiO$_3$, barium titanate, strontium titanate, PbZrO$_3$, PST (PbSc$_x$Ta$_{1-x}$O$_3$), PZN (PbZn$_x$Nb$_{1-x}$O$_3$), PZT (PbZr$_x$Ti$_{1-x}$O$_3$), PMN (PbMg$_x$Nb$_{1-x}$O$_3$).

13. The method according to claim 1, wherein the second layer is formed of a nitride material having an electrical equivalent thickness of less than about 50 Angstroms of SiO$_2$.

14. The method according to claim 1, wherein at least one of the floating gate or the control gate is formed of p-type polysilicon.

15. A method of fabricating a semiconductor device, the method comprising the steps of:
forming a gate dielectric layer on a semiconductor substrate, the gate dielectric layer comprising a first dielectric layer with a dielectric constant greater than 10 and a second dielectric layer with a dielectric constant equal to or less than 10, wherein the first dielectric layer directly contacts the semiconductor substrate, and wherein the second dielectric layer directly contacts the first dielectric layer;
forming a source and a drain within an active region of the semiconductor substrate;
forming a floating gate on the gate dielectric layer wherein the floating gate defines a channel interposed between the source and drain;
forming a control gate above the floating gate; and
forming an intergate dielectric layer interposed between the floating gate and the control gate, wherein the step of forming the intergate dielectric layer further includes the steps of:
forming a first layer on the floating gate;
forming a second layer on the first layer; and
forming a third layer on the second layer, wherein the first and third layers have a dielectric constant greater than 10, and the second layer has a dielectric constant greater than SiO$_2$.

16. The method according to claim 15, wherein the first and third layers each are formed comprising one or more of aluminum oxide, zirconium silicate, hafnium silicate, hafnium silicon oxynitride, hafnium silicon nitride, lanthanum oxide, hafnium oxide, zirconium oxide, cerium oxide, bismuth silicon oxide, titanium dioxide, tantalum oxide, tungsten oxide, yttrium oxide, lanthanum aluminum oxide, barium strontium titanate (Ba$_{1-x}$Sr$_x$TiO$_3$), barium strontium oxide (Ba$_{1-x}$Sr$_x$O$_3$), PbTiO$_3$, barium titanate, strontium titanate, PbZrO$_3$, PST (PbSc$_x$Ta$_{1-x}$O$_3$), PZN (PbZn$_x$Nb$_{1-x}$O$_3$), PZT (PbZr$_x$Ti$_{1-x}$O$_3$), PMN (PbMg$_x$Nb$_{1-x}$O$_3$).

17. The method according to claim 16, wherein the first and third layers are formed of Al$_2$O$_3$.

18. The method according to claim 17, wherein the second layer is formed of a nitride layer.

19. The method according to claim 1, wherein the semiconductor substrate comprises only a single layer.

20. The method according to claim 15, wherein the semiconductor substrate comprises only a single layer.

* * * * *